United States Patent
Choi et al.

(10) Patent No.: US 8,373,157 B2
(45) Date of Patent: Feb. 12, 2013

(54) CARBON NANO-TUBE (CNT) LIGHT EMITTING DEVICE AND METHOD OF MANUFACTURING THE SAME

(75) Inventors: Jaeyoung Choi, Suwon-si (KR); Hyeon Jin Shin, Suwon-si (KR); Seonmi Yoon, Yongin-si (KR); Seong Jae Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1011 days.

(21) Appl. No.: 11/961,577

(22) Filed: Dec. 20, 2007

(65) Prior Publication Data

US 2010/0252806 A1 Oct. 7, 2010

(30) Foreign Application Priority Data

Jul. 19, 2007 (KR) ........................ 10-2007-0072065

(51) Int. Cl.
H01L 35/24 (2006.01)
(52) U.S. Cl. ........................ 257/40; 257/13; 257/E51.04
(58) Field of Classification Search .................... 257/13, 257/40, E51.04
See application file for complete search history.

(56) References Cited

U.S. PATENT DOCUMENTS

| | | | |
|---|---|---|---|
| 7,115,916 B2 | 10/2006 | Avouris et al. | |
| 2005/0045867 A1 | 3/2005 | Ozkan et al. | |

FOREIGN PATENT DOCUMENTS

| | | |
|---|---|---|
| JP | 2003-209281 | 7/2003 |
| JP | 2004-179564 A | 6/2004 |
| JP | 2004-311733 | 11/2004 |
| JP | 2005-150410 | 6/2005 |
| JP | 2005-235887 A | 9/2005 |
| JP | 2005-268550 | 9/2005 |
| KR | 1020030041727 A | 5/2003 |
| KR | 1020050025043 A | 3/2005 |
| KR | 10-2005-0058525 | 6/2005 |
| KR | 1020050060080 A | 6/2005 |
| KR | 10-2005-0098540 | 10/2005 |
| KR | 1020050098539 A | 10/2005 |
| KR | 1020060087500 A | 8/2006 |

OTHER PUBLICATIONS

Machine Translation of KR 10-2005-0098540.*
Machine Translation of JP 2005-268550.*

* cited by examiner

*Primary Examiner* — Anthony Ho
(74) *Attorney, Agent, or Firm* — Cantor Colburn LLP

(57) ABSTRACT

Disclosed are a carbon nano-tube (CNT) light emitting device and a method of manufacturing the same. Specifically, the CNT light emitting device comprises: a CNT thin film formed using a CNT dispersed solution; a n-doping polymer formed on one end of the CNT thin film; a p-doping polymer formed on the other end of the CNT thin film; and a light emitting part between the n-doping polymer and the p-doping polymer. In addition, the method of manufacturing a CNT light emitting device comprises steps of: mixing CNTs with a dispersing agent or dispersing solvent to prepare a CNT dispersed solution; forming a CNT thin film using the CNT dispersed solution; coating a n-doping polymer on one end of the CNT thin film; and coating a p-doping polymer on the other end of the CNT thin film. According to the invention, the n-doping polymer and the p-doping polymer are respectively coated on the CNT having a CNT random network structure to implement a p-n junction, thereby implementing a light emitting device in a simple and low-priced process.

15 Claims, 3 Drawing Sheets

CARBON NANO-TUBE (CNT) LIGHT EMITTING DEVICE AND METHOD OF MANUFACTURING THE SAME

CROSS-REFERENCE TO RELATED APPLICATIONS

This application claims all benefits of Korean Patent Application No. 10-2007-0072065 filed on Jul. 19, 2007 in the Korean Intellectual Property Office, the disclosures of which are incorporated herein by reference.

BACKGROUND OF THE INVENTION

1. Field of the Invention

The present invention relates to a carbon nano-tube (CNT) light emitting device and a method of manufacturing the same, and more particularly, to a CNT light emitting device having a p-n junction formed by coating a n-doping polymer and a p-doping polymer on a CNT thin film, and a method of manufacturing the same.

2. Description of the Prior Art

Since the CNT has various excellent properties, a variety of devices using the CNT have been developed. Among them, for a light emitting device, a junction device of p-n type using a junction of n-type material and p-type material is widely used. The light emitting device uses a principle that electrons flow in the n-type material, holes flow in the p-type material and the electron and holes are connected at a junction interface of the p-n type to emit the light. This principle is widely applied to LED, OLED and the like currently used.

Accordingly, many researchers attempt to use a nano-wire and CNT having a high light-emitting efficiency while maintaining the properties of a single crystal.

The CNT is a very suitable material as the light emitting device since it has a very high mobility and the like. However, there is high difficulty in the process so as to implement the p-n junction to make a device.

SUMMARY OF THE INVENTION

The invention is to provide a CNT light emitting device and a method of manufacturing the same, capable of coating a CNT thin film having a CNT random network structure with a n-doping polymer and a p-doping polymer, thereby implementing a p-n junction on the CNT thin film easily.

In order to achieve the above object, the invention provides a CNT light emitting device and a method of manufacturing the same, and more particularly, a CNT light emitting device having a p-n junction formed by coating a n-doping polymer and a p-doping polymer on a CNT thin film, and a method of manufacturing the same.

According to the invention, a CNT thin film having a random network structure is implemented between electrodes that are apart from each other at a predetermined interval. The CNT thin film may be implemented by a vapor deposition. However, according to the invention, in order to implement a large-scaled and low-priced light emitting device, a CNT dispersed solution that is prepared using CNT ink is applied on a substrate. The CNT thin film obtained is disposed between the electrodes and polymers capable of n-doping and p-doping the CNT thin film are coated on both ends of the CNT thin film formed between the electrodes, thereby implementing a doping of the CNT thin film in a polymer coating manner.

According to the above structure, since the device has the CNT random network structure that is easily generated by a thin film growth and a coating method from CNT ink, the device can be easily implemented in a large scale.

In addition, the electron and hole portions are determined on the CNT having the random network structure by the n-doping polymer and p-doping polymer. Therefore, it is not necessary to use a gate electrode having a special structure that is needed so as to enable the electron and hole to meet.

In addition, the n-doped portion, the light emitting portion (p-n junction) and the p-doped portion are automatically generated in the single CNT strand by the polymer coating. Accordingly, it is possible to prevent the electron and hole from being lost, which is caused because the materials of the respective parts are different. As a result, it is possible to make a device having a high light emitting efficiency.

Further, since the random network of the CNT, the n-doping polymer and the p-doping polymer can be implemented by a very economical printing method, a light emitting device can be implemented at low price.

Specifically, a CNT light emitting device according to the invention comprises: a CNT thin film formed using a CNT dispersed solution; a n-doping polymer formed on one end of the CNT thin film; a p-doping polymer formed on the other end of the CNT thin film; and a light emitting part between the n-doping polymer and the p-doping polymer.

In addition, a method of manufacturing a CNT light emitting device according to the invention comprises steps of: mixing CNT with a dispersing agent or dispersing solvent to prepare a CNT dispersed solution; forming a CNT thin film using the CNT dispersed solution; coating a n-coating polymer on one end of the CNT thin film; and coating a p-doping polymer on the other end of the CNT thin film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description of the present invention, a detailed description of known functions and configurations incorporated herein will be omitted when it may make the subject matter of the present invention rather unclear.

Figure 1:
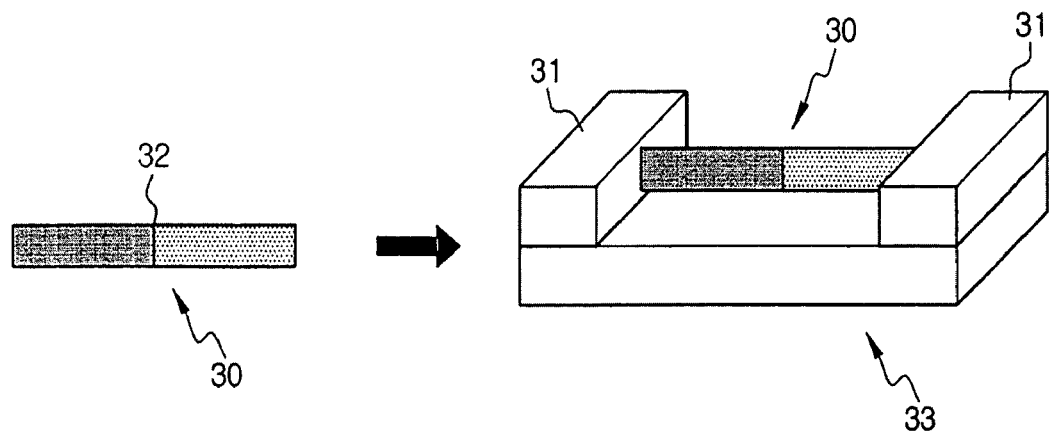
FIG. 1 is a schematic view showing a process of manufacturing a light emitting device using a nano-wire having a p-n junction according to an embodiment of the invention.

FIG. 1 is a schematic view showing a process of manufacturing a light emitting device 33 using a nano-wire 30 having a p-n junction 32, according to an embodiment of the invention. As shown in FIG. 1, the nano-wire 30 is coated with polymers capable of n-doping and p-doping the nano-wire 30, so that the nano-wire portions covered with the n-doping polymer and p-doping polymer become a n-doped nano-wire and a p-doped nano-wire and a p-n junction 32 is naturally formed at an interface of the n-doping polymer and p-doping polymer. Like this, the nano-wire 30 having the p-n junction 32 formed is disposed between electrodes 31, so that a light emitting device 33 can be easily implemented.

The CNT is classified into metallic, semi-metallic and semiconducting types. The CNT of armchair having no chirality is a metallic CNT having a bandgap of 0 and is again classified into semi-metallic and semiconducting types having a bandgap depending on a degree of the chirality. Since the CNT of the invention is used as a p-n junction device, it is preferable to use a semiconducting CNT. The reason is that there may occur a current leakage when a ratio of the metallic type is high. However, a predetermined ratio of a metallic type may be present depending on applications of the light emitting device.

Figure 2:
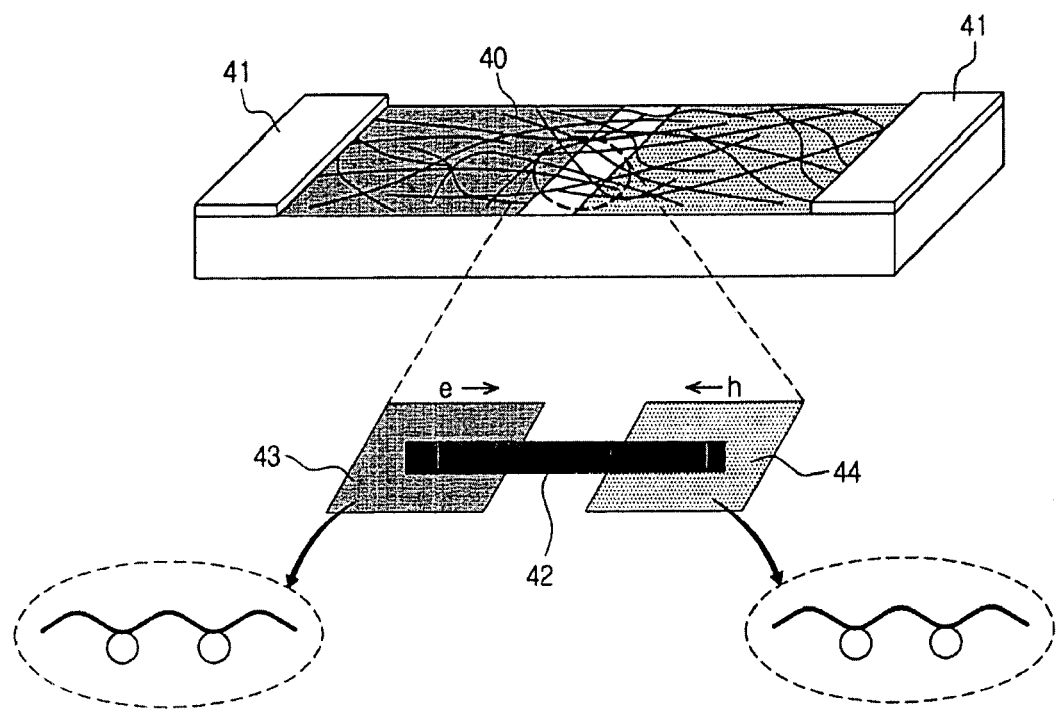
FIG. 2 shows a CNT light emitting device prepared using a CNT thin film coated with n-doping and p-doping polymers according to an embodiment of the invention.

FIG. 2 shows a CNT light emitting device prepared using a CNT thin film 40 coated with a n-doping polymer 43 and a p-doping polymer 44 according to an embodiment of the invention. Like this, according to the invention, the CNT thin film 40 having a CNT random network structure is implemented in a manner of applying a CNT dispersed solution on a substrate. Then, the n-doping polymer 43 and the p-doping polymer 44 are coated on the CNT thin film 40, so that a light emitting device having a p-n junction, which is a light emitting part 42, can be implemented in a very easy and low-priced process.

In the course of preparing the CNT light emitting device as shown in FIG. 2, each process will be described.

The CNT thin film having a random network structure formed by the CNT can be formed in a manner of applying the CNT dispersed solution, which is obtained by dispersing the CNTs in a solvent, on a substrate.

In the method of preparing CNT dispersed solution, a high-purity CNT 1 mg is first put in a 20 mL glass bottle, into which NMP (N-methylpyrrolidine) 10 mL is then put. Then, it is put in an ultrasonic bath that is then subject to a sonification process for 10 minutes. The CNT-NMP solution is put in a 50 mL conical tube, which is then centrifugally separated at 10,000 rpm for 10 minutes. After the centrifugal separation, only the CNT dispersed solution that is not deposited is taken to prepare a CNT dispersed solution.

Then, as the method of manufacturing a CNT thin film having a CNT random network structure, a spray method is used wherein a substrate is covered with a mask having apertures formed at portions requiring the CNT coating and the CNT dispersed solution prepared in the above step is coated with a spray device. In this case, a spin coating, an inkjet coating and the like can be used.

Alternatively, a vapor deposition method such as chemical vapor deposition (CVD) may be used to implement a CNT thin film having a CNT random network structure.

Furthermore, the CNT random network structure of the invention may be formed by forming a CNT random network structure on another substrate and then transferring it on a substrate on which it is desired to make a light emitting device. In addition, it is possible to use the CNTs that are arranged in one direction or specific direction, depending on a process of forming a CNT thin film having a CNT random network structure of the invention.

For the CNT thin film having the CNT random network structure prepared according to the above manner, both ends of the CNT thin film are coated with the n-doping and p-doping polymers to implement a p-n junction.

The polymer capable of n-doping the CNT thin film is a polymer having an electron withdrawing property and includes, for example polymers that contain sulfonate, nitrate, fluoro, sulfur and the like capable of withdrawing an electron. The polymer containing the sulfonate may include polystyrenesulfonate (PSS).

In addition, the polymer capable of p-doping the CNT thin film is a polymer having an electron donating property and includes, for example polymers that contain alkali metal, alkali earth metal, amine and the like capable of donating an electron. The polymer containing the amine may include polyetherimide (PEI).

According to the invention, when the CNT thin film having a CNT random network structure is formed and the polymers are then formed on the CNT thin film, the n-doping polymer and the p-doping polymer can be coated in various manners depending on design conditions of a device. This is exemplified in FIGS. 5A and 5B.

Figure 3A:
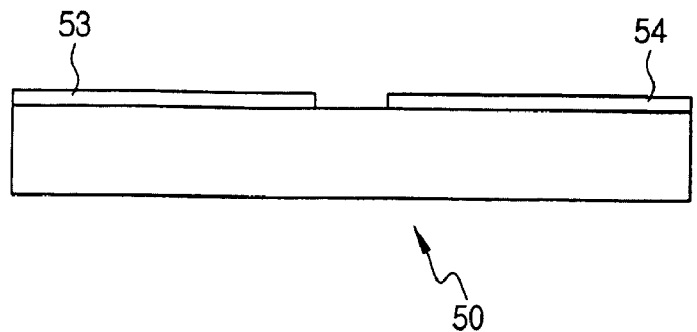
FIG. 3A shows that n-doping and p-doping polymers are formed at a predetermined interval on a CNT thin film, according to an embodiment of the invention.

FIG. 3A shows that n-doping and p-doping polymers are formed at a predetermined interval on a CNT thin film, according to an embodiment of the invention. In other words, FIG. 3A shows a doped state of the CNT formed at an interval in a case where the n-doping polymer is first coated on one end of the CNT thin film having a CNT random network structure and the p-doping polymer is coated at the interval on the other end of the CNT thin film. In this case, it is possible to implement, as a light emitting part, a CNT light emitting device having a state in which an interval is formed between the n-doped CNT and the p-doped CNT.

Figure 3B:
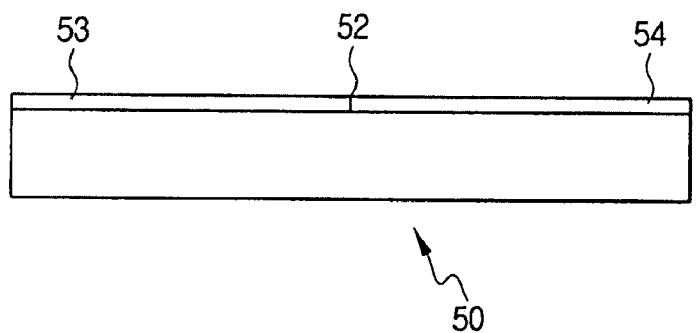
FIG. 3B shows that n-doping and p-doping polymers are formed on a CNT thin film without an interval to form a p-n junction, according to an embodiment of the invention.

FIG. 3B shows that n-doping and p-doping polymers are formed on a CNT thin film without an interval to form a p-n junction, according to an embodiment of the invention. In other words, FIG. 3B shows a case where the n-doping polymer and the p-doping polymer are coated without an interval on both ends of the CNT thin film having a CNT random network structure. In this case, it is possible to implement a CNT light emitting device in a state in which a p-n junction is formed without an interval between the n-doped CNT and the p-doped CNT. In the mean time, in the case of FIG. 3B, it may be difficult to coat the n-doping polymer and the p-doping polymer without an interval.

In order to solve the above problem in FIG. 3B, a half of the CNT thin film having a CNT random network structure may be first coated with the n-doping polymer and the p-doping polymer may be coated over an entire of the CNT thin film, thereby forming a p-n juction.

Figure 3C:
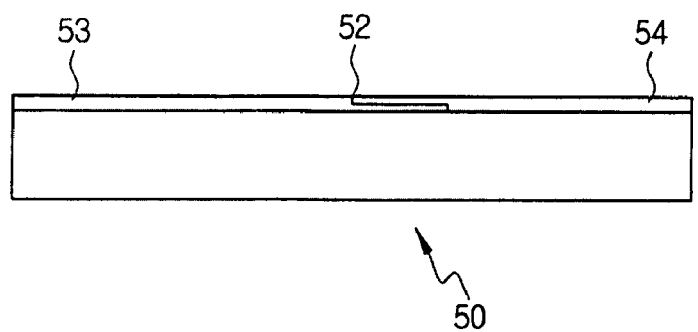
FIG. 3C shows that n-doping and p-doping polymers are overlapped on a CNT thin film to form a p-n junction, according to an embodiment of the invention.

In addition, for example, as shown in FIG. 3C, according to an embodiment of the invention, the n-doping polymer and the p-doping polymer may be overlapped on the CNT thin film, thereby forming a p-n junction. According to this manner, it is possible to easily implement a p-n junction without caring about the coating accuracy. In addition, although not shown, according to an embodiment of the invention, it is possible to implement a p-n junction by coating the n-doping polymer or p-doping polymer on a half only of the CNT thin film having a CNT random network structure, depending on the doped state of the raw CNT material or properties required for the device.

As described above, according to the invention, a CNT thin film having a CNT random network structure is formed and n-doping and p-doping polymers are coated on the CNT thin film, thereby forming a state having an interval as a light emitting part, or a state in which a p-n junction is formed without an interval between the n-doped CNT and the p-doped CNT.

In order to adjust a wavelength of the light to be emitted from the interfaces of the p-n junction, it is possible to use an energy difference of the doped CNT. In addition, in order to variably control the wavelength of the light to express a visible ray region, it is possible to adjust the doping intensities of the n-doping polymer and the p-doping polymer to control the colors of the emitted light.

Figure 4:
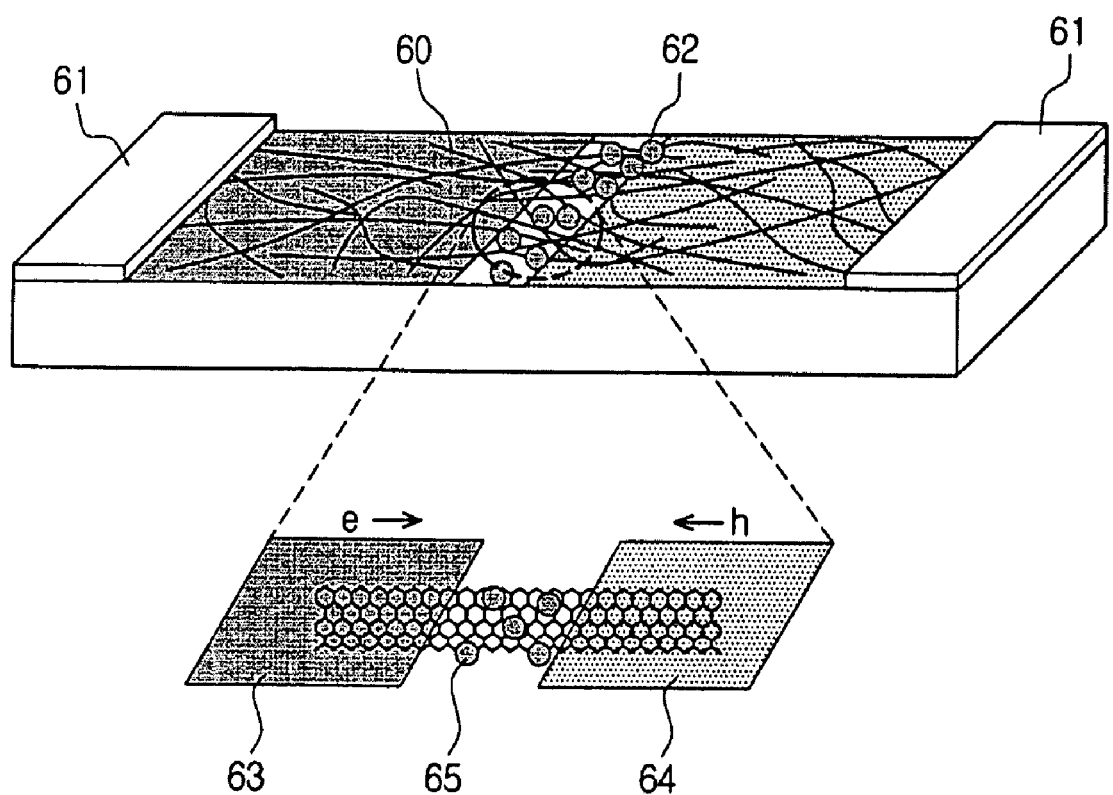
FIG. 4 shows that light emitting material is coated on a light emitting part between a n-doping polymer and a p-doping polymer coated on a CNT thin film, according to an embodiment of the invention.

Further, as shown in FIG. 4, it is possible to adjust a wavelength of the color of the emitted light by coating a light emitting material 65 at the p-n junction or the light emitting part 62 that is an interval between the n-doping polymer and the p-doping polymer. In other words, FIG. 4 shows that the light emitting material 65 is coated at the light emitting part 62 between the n-doping polymer 63 and the p-doping polymer 64. As the light emitting material 65, an inorganic light emitting material such as quantum dot or organic material can be used.

As described above, according to the invention, the CNT dispersed solution is prepared using the CNT ink and is applied to the substrate, thereby providing a CNT thin film having a CNT random network structure. Then, the n-doping polymer and the p-doping polymer are respectively coated on both ends of the CNT thin film, thereby implementing a p-n junction. Like this, it is possible to implement a light emitting device in a simple and low-priced process.

Specifically, since it is not necessary to correctly arrange the CNT and the random network structure is provided, the device can be easily implemented in a large scale. Since the random network structure is easily generated by a thin film growth and a coating method from CNT ink, the device can be easily implemented so that it can be large-sized.

In addition, according to the invention, the electron and hole portions are determined on the CNT having the random network structure by the n-doping polymer and p-doping polymer. Therefore, it is not necessary to use a gate electrode having a special structure that is needed so as to enable the electron and hole to meet.

In addition, according to the invention, in the structure of the p-n junction that is formed by coating the n-doping polymer and p-doping polymer on the CNT having the random network structure, both ends of the single CNT strand are n-doped and p-doped. In other words, the n-doped portion, the light emitting portion (p-n junction) and the p-doped portion are automatically generated in the single CNT strand by the polymer coating. Accordingly, it is possible to prevent the electron and hole from being lost, which is caused because the materials of the respective parts are different. As a result, it is possible to make a device having a high light emitting efficiency.

Further, according to the invention, since the random network of the CNT, the n-doping polymer and the p-doping polymer can be implemented by a very economical printing method, a light emitting device can be implemented at low price.

In addition, the CNT thin film including the p-n junction can be widely used for LED, OLED and the like.

While the invention has been shown and described with reference to certain preferred embodiments thereof, it will be understood by those skilled in the art that various changes in form and details may be made thereto without departing from the spirit and scope of the invention as defined by the appended claims.

What is claimed is:

1. A carbon nano-tube (CNT) light emitting device comprising:
   a substrate;
   a CNT thin film comprising CNTs having a random network structure on the substrate;
   a n-doping polymer on one end of the CNT thin film;
   a p-doping polymer on the other end of the CNT thin film; and
   a light emitting part between the n-doping polymer and the p-doping polymer, wherein the light emitting part comprises a p-n junction in a portion of the CNT film between the n-doping polymer and the p-doping polymer.

2. The CNT light emitting device according to claim 1, wherein the CNT is a semiconducting CNT.

3. The CNT light emitting device according to claim 1, wherein the n-doping polymer and the p-doping polymer are formed without an interval on the CNT thin film to form a p-n junction at an interface of the n-doping polymer and the p-doping polymer.

4. The CNT light emitting device according to claim 1, wherein the n-doping polymer and the p-doping polymer are formed at an interval on the CNT thin film.

5. The CNT light emitting device according to claim 1, wherein the n-doping polymer is able to withdraw an electron from the CNT.

6. The CNT light emitting device according to claim 5, wherein the n-doping polymer contains a material selected from a group consisting of sulfonate, nitrate, fluoro and sulfur.

7. The CNT light emitting device according to claim 6, wherein the n-doping polymer containing the sulfonate is polystyrenesulfonate (PSS).

8. The CNT light emitting device according to claim 1, wherein the p-doping polymer is able to donate an electron to the CNT.

9. The CNT light emitting device according to claim 8, wherein the p-doping polymer contains a material selected from a group consisting of alkali metal, alkali earth metal and amine.

10. The CNT light emitting device according to claim 9, wherein the p-doping polymer containing the amine is polyetherimide (PEI).

11. The CNT light emitting device according to claim 1, wherein doping intensities of the p-doping polymer and the n-doping polymer are adjusted to control a color of light emitted.

12. The CNT light emitting device according to claim 1, wherein the light emitting part is coated with an inorganic light emitting material or organic light emitting material.

13. The CNT light emitting device according to claim 12, wherein the inorganic light emitting material is quantum dot.

14. A CNT light receiving device comprising:
    a substrate;
    a CNT thin film comprising CNTs having a random network structure on the substrate;
    a n-doping polymer on one end of the CNT thin film;
    a p-doping polymer on the other end of the CNT thin film; and
    a light receiving part between the n-doping polymer and the p-doping polymer, wherein the light receiving part comprises a p-n junction in a portion of the CNT film between the n-doping polymer and the p-doping polymer.

15. The CNT light receiving device according to claim 14, wherein the n-doping polymer contains a material selected from a group consisting of sulfonate, nitrate, fluoro and sulfur.

* * * * *